United States Patent
Monangi et al.

(10) Patent No.: US 10,903,843 B1
(45) Date of Patent: Jan. 26, 2021

(54) SAR ADC WITH VARIABLE SAMPLING CAPACITOR

(71) Applicant: Analog Devices International Unlimited Company, Limerick (IE)

(72) Inventors: Sandeep Monangi, Srikakulam (IN); Michael C. W. Coln, Lexington, MA (US); Archana Patil, Maharashtra (IN)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/791,717

(22) Filed: Feb. 14, 2020

(51) Int. Cl.
*H03M 1/38* (2006.01)
*H03M 1/12* (2006.01)
*H03M 1/46* (2006.01)

(52) U.S. Cl.
CPC ......... *H03M 1/1245* (2013.01); *H03M 1/462* (2013.01)

(58) Field of Classification Search
CPC ............................ H03M 1/1245; H03M 1/462
USPC .................... 341/155, 144, 161, 172, 122
See application file for complete search history.

(56) References Cited

U.S. PATENT DOCUMENTS

| | | | |
|---|---|---|---|
| 6,473,021 B1 * | 10/2002 | Somayajula | H03M 1/68 341/155 |
| 6,545,623 B1 | 4/2003 | Yu | |
| 7,046,046 B2 | 5/2006 | Temes et al. | |
| 7,924,203 B2 | 4/2011 | Hurrell | |
| 8,766,839 B2 | 7/2014 | Janakiraman et al. | |
| 9,608,655 B1 | 3/2017 | Li et al. | |
| 9,654,131 B1 | 5/2017 | Fuchs et al. | |
| 10,511,316 B2 | 12/2019 | Bodnar et al. | |
| 2010/0156684 A1 | 6/2010 | Westwick et al. | |
| 2019/0131986 A1 * | 5/2019 | Vinje | H03M 1/1023 |
| 2020/0021305 A1 * | 1/2020 | Monangi | H03M 1/1245 |
| 2020/0195266 A1 * | 6/2020 | Chao | H03M 1/1033 |

FOREIGN PATENT DOCUMENTS

| | | |
|---|---|---|
| CN | 1934787 A | 3/2007 |
| EP | 2686960 B1 | 4/2015 |
| EP | 3322096 B1 | 1/2020 |
| KR | 101182402 B1 | 9/2012 |

OTHER PUBLICATIONS

Chung, Yung-Hui, et al., "A 12-bit 40-MS/s SAR ADC With a Fast-Binary-Window DAC Switching Scheme", IEEE Transactions on Very Large Scale Integration (VLSI) Systems (preprint), (2018), 10 pgs.

* cited by examiner

*Primary Examiner* — Peguy Jean Pierre
(74) *Attorney, Agent, or Firm* — Schwegman Lundberg & Woessner, P.A.

(57) ABSTRACT

A successive approximation register analog-to-digital converter (SAR ADC) circuit comprises N weighted bit capacitors, wherein N is a positive integer greater than one; a sampling circuit configured to sample an input voltage onto the N weighted bit capacitors; and logic circuitry. The logic circuitry is configured to enable sampling of the input voltage onto the N weighted bit capacitors in a high-resolution mode; enable sampling of the input voltage onto N–M of the weighted bit capacitors in a low-resolution mode and sampling a common mode voltage onto the most significant M weighted bit capacitors, wherein M is a positive integer greater than zero and less than N; and initiate successive bit trials using the weighted bit capacitors to convert the sampled input voltage to a digital value.

21 Claims, 10 Drawing Sheets

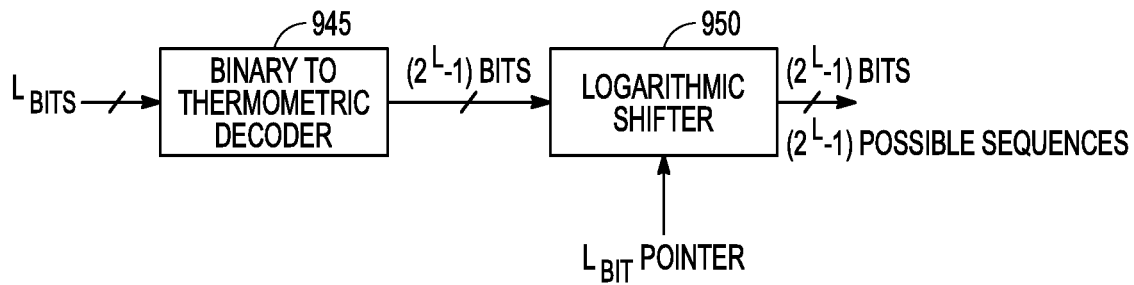
FIG. 9
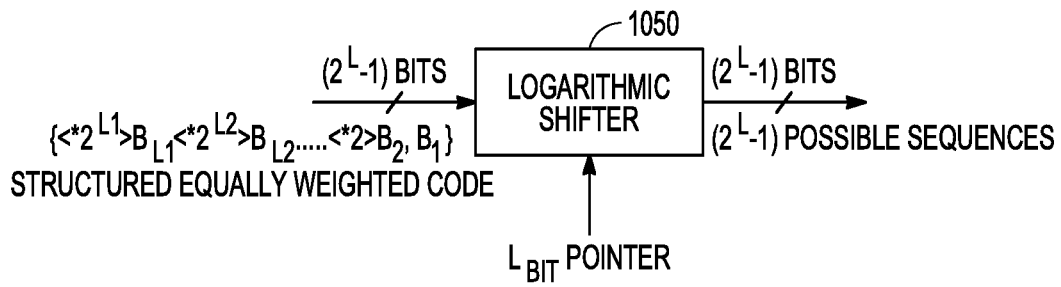
FIG. 10
| BINARY CODE | THERMOMETRIC CODE | STRUCTURED EQUALLY-WEIGHTED CODE |
| --- | --- | --- |
| 000 | 0000000 | 0000000 |
| 001 | 0000001 | 0000001 |
| 010 | 0000011 | 0000110 |
| 011 | 0000111 | 0000111 |
| 100 | 0001111 | 1111000 |
| 101 | 0011111 | 1111001 |
| 110 | 0111111 | 1111110 |
| 111 | 1111111 | 1111111 |
FIG. 11

| INPUT | STAGE 1 | STAGE 2 | STAGE 3 | STAGE 4 |
|---|---|---|---|---|
| 16 | 16 | 16 15 14 13 12 11 10 9 8 7 6 5 4 3 2 1 | 16 15 14 13 12 11 10 9 8 7 6 5 4 3 2 1 9 10 11 12 13 14 15 16 | 16 15 14 13 12 11 10 9 8 7 6 5 4 3 2 1 |
| 15 | 15 | 15 14 13 12 11 10 9 8 7 6 5 4 3 2 1 16 | 15 14 13 12 11 10 9 8 7 6 5 4 3 2 1 16 8 9 10 11 12 13 14 15 | 15 14 13 12 11 10 9 8 7 6 5 4 3 2 1 16 |
| 14 | 14 | 14 13 12 11 10 9 8 7 6 5 4 3 2 1 16 15 | 14 13 12 11 10 9 8 7 6 5 4 3 2 1 16 15 7 8 9 10 11 12 13 14 | 14 13 12 11 10 9 8 7 6 5 4 3 2 1 16 15 |
| 13 | 13 | 13 12 11 10 9 8 7 6 5 4 3 2 1 16 15 14 | 13 12 11 10 9 8 7 6 5 4 3 2 1 16 15 14 6 7 8 9 10 11 12 13 | 13 12 11 10 9 8 7 6 5 4 3 2 1 16 15 14 |

(OUTPUT HAS 16-POSSIBLE COMBINATIONS. PROBABILITY OF AN INPUT BIT REACHING ANY OUTPUT POSITION IS SAME.)

| INPUT | STAGE 1 | STAGE 2 | STAGE 3 | STAGE 4 |
|---|---|---|---|---|
| | | | | ← OUTPUT COMBINATIONS IN LOW RESOLUTION MODE. 8-POSSIBLE COMBINATIONS. → | | | | | ← OUTPUT COMBINATIONS IN HIGH RESOLUTION MODE. 16-POSSIBLE COMBINATIONS. → |

POSSIBLE SEQUENCES AT OUTPUT OF

| INPUT | STAGE 1 | STAGE 2 | STAGE 3 | STAGE 4 |
|---|---|---|---|---|
| 16 | | | | 16 16 16 16 16 16 16 16 16 15 14 13 12 11 10 9 8 7 6 5 4 3 2 1 |
| 15 | | | | 15 15 15 15 15 15 15 15 15 14 13 12 11 10 9 8 7 6 5 4 3 2 1 16 |
| 14 | | | | 14 14 14 14 14 14 14 14 14 13 12 11 10 9 8 7 6 5 4 3 2 1 16 15 |
| 13 | | | | 13 13 13 13 13 13 13 13 13 12 11 10 9 8 7 6 5 4 3 2 1 16 15 14 |
| 12 | | | | 12 12 12 12 12 12 12 12 12 11 10 9 8 7 6 5 4 3 2 1 16 15 14 13 |
| 11 | | | | 11 11 11 11 11 11 11 11 11 10 9 8 7 6 5 4 3 2 1 16 15 14 13 12 |
| 10 | | | | 10 10 10 10 10 10 10 10 10 9 8 7 6 5 4 3 2 1 16 15 14 13 12 11 |
| 9 | | | | 9 9 9 9 9 9 9 9 9 8 7 6 5 4 3 2 1 16 15 14 13 12 11 10 |
| 8 | 8 | 8 | 8 | 8 7 6 5 4 3 2 1 16 15 14 13 12 11 10 9 |
| 7 | 7 | 7 | 7 | 7 6 5 4 3 2 1 8 16 15 14 13 12 11 10 9 |
| 6 | 6 | 6 | 6 | 6 5 4 3 2 1 8 7 16 15 14 13 12 11 10 9 |
| 5 | 5 | 5 | 5 | 5 4 3 2 1 8 7 6 16 15 14 13 12 11 10 9 |
| 4 | 4 | 4 | 4 | 4 3 2 1 8 7 6 5 16 15 14 13 12 11 10 9 |
| 3 | 3 | 3 | 3 | 3 2 1 8 7 6 5 4 16 15 14 13 12 11 10 9 |
| 2 | 2 | 2 | 2 | 2 1 8 7 6 5 4 3 16 15 14 13 12 11 10 9 |
| 1 | 1 | 1 | 1 | 1 8 7 6 5 4 3 2 16 15 14 13 12 11 10 9 |

US 10,903,843 B1

SAR ADC WITH VARIABLE SAMPLING CAPACITOR

FIELD OF THE DISCLOSURE

This document relates to integrated circuits and in particular to analog-to-digital converter (ADC) circuits.

BACKGROUND

ADC circuits are used to quantify an analog signal as a digital quantity that can be used in signal processing. Typically, an ADC circuit is designed for a particular application. This involves a development cost for a new application that needs an ADC. It is desirable to have an ADC circuit that can be portable among multiple applications.

SUMMARY OF THE DISCLOSURE

This document relates generally to analog-to-digital converters (ADC), and more specifically to ADCs with configurable resolution. In some aspects, a successive approximation register analog-to-digital converter (SAR ADC) circuit comprises N weighted bit capacitors, where N is a positive integer greater than one; a sampling circuit configured to sample an input voltage onto the N weighted bit capacitors; and logic circuitry. The logic circuitry is configured to enable sampling of the input voltage onto the N weighted bit capacitors in a high-resolution mode; enable sampling of the input voltage onto N−M of the weighted bit capacitors in a low-resolution mode and sampling a common mode voltage onto the most significant M weighted bit capacitors, wherein M is a positive integer greater than zero and less than N; and initiate successive bit trials using the weighted bit capacitors to convert the sampled input voltage to a digital value.

In some aspects, a method of operating an SAR ADC circuit comprises sampling an input voltage onto N weighted bit capacitors when the SAR ADC circuit is configured in a high-resolution mode, wherein N is a positive integer greater than one; sampling the input voltage onto N−M of the weighted bit capacitors and sampling a common mode voltage onto the most significant M weighted bit capacitors when the SAR ADC circuit is configured in a low-resolution mode, wherein M is a positive integer greater than zero and less than N; and converting the sampled input voltage to a digital value in the high-resolution mode and, when the SAR ADC circuit is configured in the low-resolution mode, converting the sampled input voltage to a digital value having less bits than in the high-resolution mode.

In some aspects, an ADC circuit includes a first digital-to-analog converter (DAC) circuit, a sampling circuit, a comparator circuit coupled to the DAC circuit, and logic circuitry coupled to the first DAC circuit, the sampling circuit, and the comparator circuit. The first DAC circuit includes N weighted bit capacitors, wherein N is a positive integer greater than one. The sampling circuit includes multiple switch circuits and an input amplifier circuit coupled to the N weighted bit capacitors, wherein the sampling circuit is configured to sample an input voltage onto the N weighted bit capacitors. The logic circuitry is configured to initiate, in a high-resolution mode, sampling of the input voltage onto the N weighted bit capacitors and successive bit trials to convert the input voltage to a digital value by comparing an output of the first DAC circuit using the comparator circuit; and initiate, in a low-resolution mode, sampling of the input voltage onto N−M of the least significant of the N weighted bit capacitors and sample a common mode voltage onto M the most significant of the N weighted bit capacitors and successive bit trials to convert the input voltage to a digital value having less bits than in the high-resolution mode, wherein M is a positive integer less than N.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 9 is a block diagram of an example of logic to shuffle bits of an ADC.

FIG. 10 is a block diagram of an example of logic to shuffle bits of an ADC.

FIG. 11 shows an example of a binary code and the corresponding thermometric code and structured equally-weighted code.

FIG. 13 is a table showing results of the logarithmic shifting.

FIG. 16 is a table that shows the results of the shifting by the logarithmic shifters of FIGS. 14 and 15.

DETAILED DESCRIPTION

Figure 1:
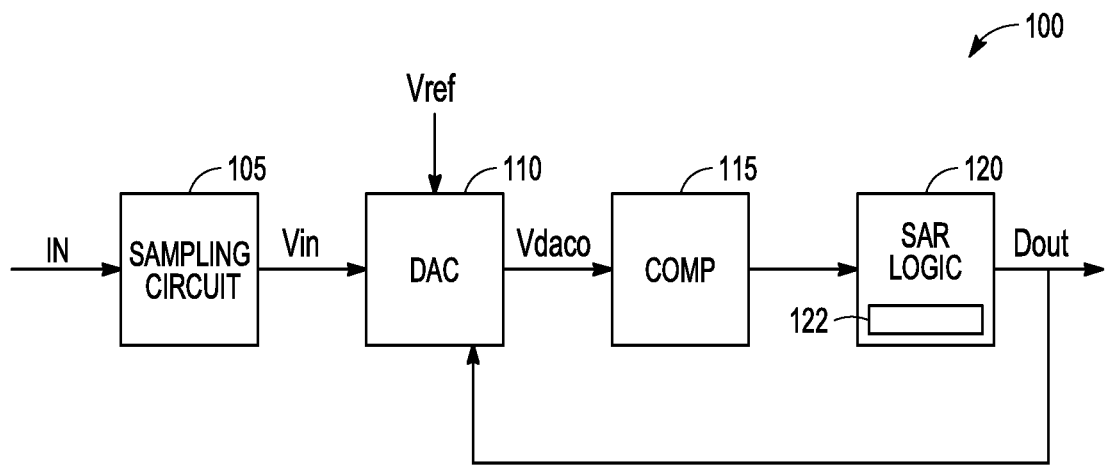
FIG. 1 is a functional block diagram of an example of a successive approximation register analog-to-digital converter (SAR ADC) circuit.

FIG. 1 is a functional block diagram of an example of a successive approximation register analog-to-digital converter (SAR ADC) circuit 100. The SAR ADC circuit includes a digital-to-analog converter (DAC) circuit 110, a sampling circuit 105 that may be included in the DAC circuit 110, a comparator circuit 115, and logic circuitry 120. The DAC circuit 110 includes N weighted circuit components, N being a positive integer. In certain examples, the SAR ADC is a 16-bit ADC, and the DAC includes sixteen capacitors as the weighted circuit components. The sampling circuit 105 samples an input voltage at an input to the ADC circuit and holds a sampled voltage for comparison to the weighted circuit components. In certain examples, the DAC circuit 110 is a differential DAC circuit and a differential analog voltage is sampled and converted.

An output voltage of the DAC circuit 110 (Vdaco) is compared to the sampled and held voltage using comparator circuit 115. The bit values of the DAC circuit 110 are adjusted based on the output of the comparator circuit. The conversion may start with the DAC set to midscale (e.g., using a voltage reference). The comparator circuit 115 determines whether the DAC output is greater or less than the sampled input voltage and the result is stored as a one or zero for that bit of the DAC by connecting the capacitor to either $V_{REF}$ or circuit ground (GND). Conversion then proceeds to the next bit value until all bits of the digital value are determined. One iteration of changing the DAC output and comparing the voltage to the input voltage can be referred to as a bit trial.

The SAR logic circuitry 120 controls the ADC operation during the bit trials. The SAR logic circuitry 120 initiates one sample of the input voltage, initiates the first conversion of the sampled input voltage to a first set of bit values using the bit trials, and initiates a second conversion of the sampled input voltage to a second set of bit values. The logic circuitry can include a digital engine 122 to perform functions such as progressing the ADC through different states of operation and to perform the calculations described. The logic circuitry 120 determines the final digital value (e.g., a 16-bit digital value) for the sampled input voltage and the final digital value is available at output Dout.

Figure 2:
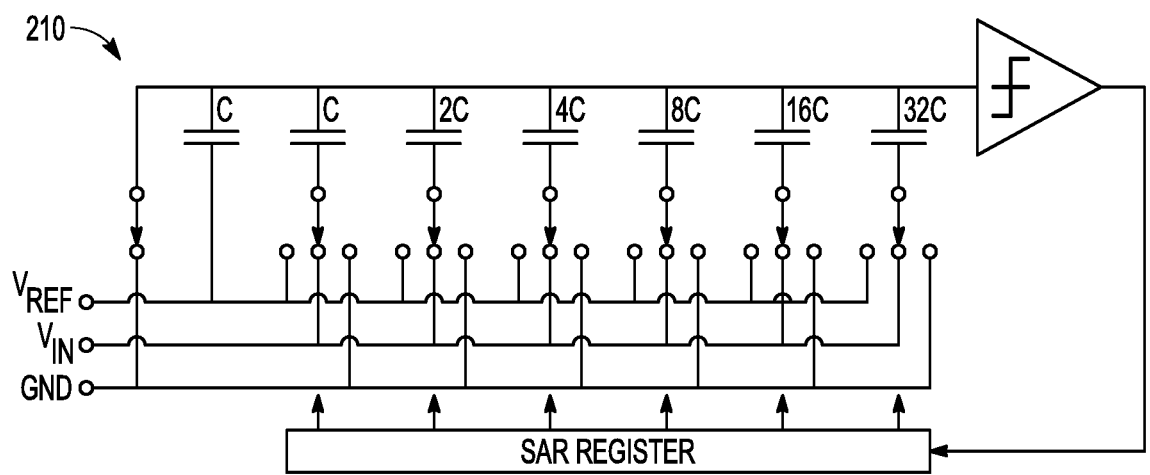
FIG. 2 is a circuit diagram of portions of an example of a digital-to-analog converter (DAC) circuit.

FIG. 2 is a circuit diagram of portions of an example of a DAC circuit 210 for an eight-bit SAR ADC (N=8). The DAC circuit 210 includes an array of weighted bit capacitors and includes an array of switch circuits that can be included in a sampling circuit, such as sampling circuit 105 of FIG. 1. The switches are configured by logic circuitry for a sampling phase, a conversion phase, and a reset phase of the DAC circuit. The DAC circuit in the example of FIG. 2 is shown in the acquisition phase and the capacitors are coupled to VIN.

Figure 3:
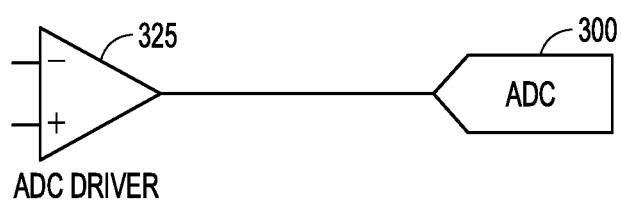
FIG. 3 is a block diagram of an example of a circuit that includes an ADC driver and an ADC.

FIG. 3 is a block diagram of an example of a circuit that includes an ADC driver 325 and an ADC 300. The ADC driver can be an input amplifier that drives the input signal to be converted onto the weighted bit capacitors of the ADC 300 during the sampling phase. It is desirable to reduce the power needed by the input amplifier to reduce the overall power consumed by the signal chain.

Additionally, it is desirable to have one design that can be re-used for multiple applications. One approach for a re-useable design is to develop an ADC "slice" that is sized to the smallest desired size. Multiple slices can then be used in parallel to achieve the signal-to-noise ratio (SNR) desired for an implementation. A challenge with such an approach is the additional circuit area taken up by the sliced approach. For example, if two ADC slices are used, each slice will occupy more than one-half the circuit area of a single ADC that could meet the same requirements. Also, the multiple ADC slices together will have more parasitic capacitance than that of a single ADC, which can degrade the SNR.

An improved approach to reduce the power demands of the input amplifier of the ADC is to scale the sampling capacitors depending on the desired implementation. Some designs may require a high-resolution ADC (e.g., a 16-bit implementation), while some designs may use a low-resolution ADC (e.g., a 14-bit implementation). One ADC design can be provided that is configurable into a high-resolution mode or a low-resolution mode depending on the state of one signal that selects the resolution of the ADC. The capacitance of the ADC driven by the input amplifier during sampling is scaled so that that the input amplifier is only driving a capacitance that is needed for the application. This allows one ADC to be tailored to multiple different applications, thereby reducing or removing the development cost of an ADC system for the different applications.

Figure 4:
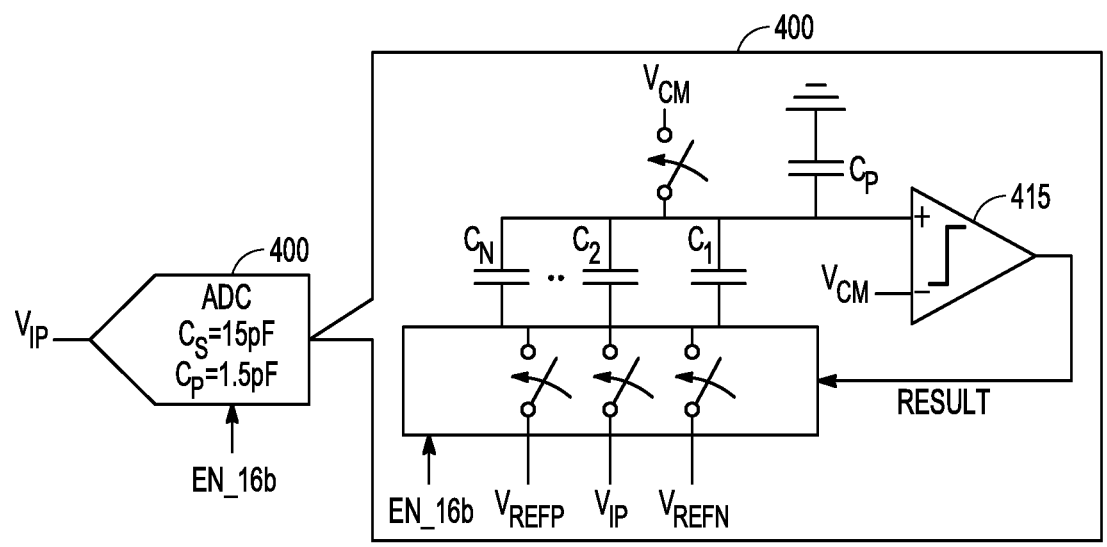
FIG. 4 is a block diagram of an ADC circuit showing a portion of the DAC circuit and a comparator used for bit trials.

FIG. 4 is a block diagram of an ADC circuit 400 showing a portion of the DAC circuit and showing the comparator 415 used for the bit trials. The ADC circuit 400 includes weighted bit capacitors numbered $C_1, C_2, \ldots C_N$, where $C_1$ is the capacitor for the most significant bit (MSB), and $C_N$ (e.g., $C_{16}$ if N=16) is the least significant bit (LSB). In the sampling phase, the input voltage is sampled onto the capacitors with respect the common mode voltage $V_{CM}$. In the example of FIG. 4, the total sampling capacitance ($C_S$) is 15 picofarads or 15 pF, and the parasitic capacitance ($C_P$) is 1.5 pF. Half of the sampling capacitance is due to the MSB capacitor $C_1$. By reducing or removing the MSB capacitance from the sampling in the low-resolution mode, the sampling capacitance is reduced, and the drive needed by the input amplifier is reduced.

Figure 5A:
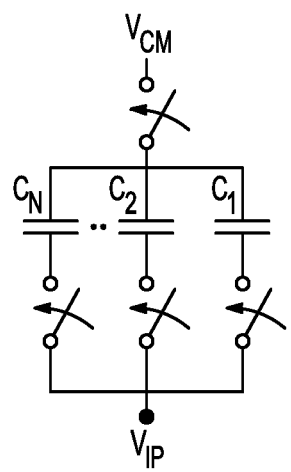
FIGS. 5A-5B show the configuration of the weighted bit capacitors of a DAC in the sampling phase.
Figure 5B:
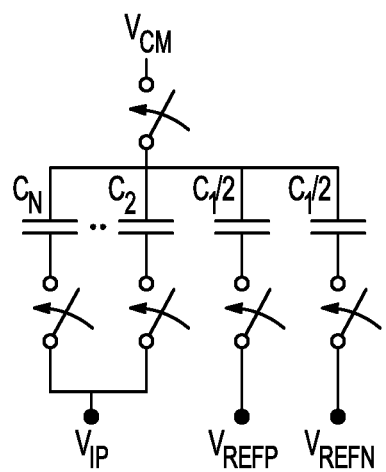

FIGS. 5A-5B show the configuration of the weighted bit capacitors of a DAC in the acquisition or sampling phase. FIG. 5A shows the acquisition phase for the high-resolution (e.g., 16-bit) mode. FIG. 5B shows the acquisition phase for the low-resolution (e.g., 14-bit) mode. The common mode voltage ($V_{CM}$) is sampled onto the MSB capacitor. One way to do this is to implement MSB capacitor $C_1$ as split into two half-capacitors ($C_1/2$). $V_{CM}$ is effectively sampled onto the MSB capacitor by sampling $V_{REFP}$ onto one half of the MSB capacitor and sampling $V_{REFN}$ onto the other half of the MSB capacitor. The input amplifier does not have to drive the MSB capacitor in the low-resolution mode. In the high-resolution mode, the two half-capacitors are added together and the MSB capacitor is included in the sampling of the input voltage. Another way to sample $V_{CM}$ onto the MSB is to sample a supply voltage that is sufficiently close to $V_{CM}$ onto the MSB if such a supply voltage is available.

Figure 6A:
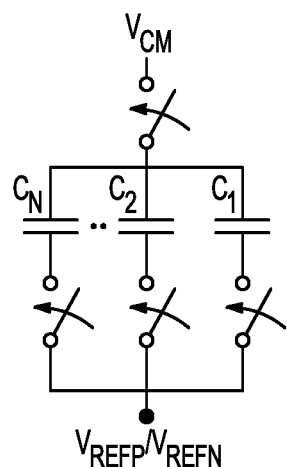
FIGS. 6A-6B show the configuration of the weighted bit capacitors of a DAC in the conversion phase.
Figure 6B:
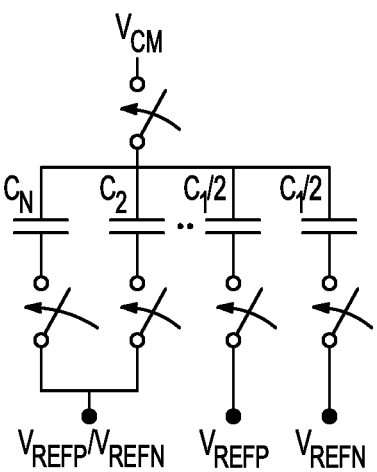

Because the MSB capacitor is removed from the sampling in the low-resolution mode, the input amplifier only sees $C_S/2$ during the acquisition phase. FIGS. 6A-6B show the configuration of the weighted bit capacitors in the conversion phase. In the low-resolution mode, the MSB capacitor can be excluded from the bit trials of the conversion process that produce a digital value. For example, if the high-resolution mode is a 16-bit conversion, 14 or 15 bit trials may be performed in the low-resolution mode using the capacitors $C_2, C_3 \ldots C_N$ to generate a 14-bit or 15-bit result. In variations, the MSB capacitor can be included in the conversion to a digital value, but because the MSB capacitor (or the two half MSB capacitors) is connected to $V_{CM}$ or connected to both $V_{REFP}$ and $V_{REFN}$, including the MSB capacitor in the conversion does not affect the results.

The switch circuits used in the sampling may include a bootstrap circuit. A bootstrap circuit improves the linearity of the sample by providing a uniform gate-to-source voltage ($V_{GS}$) to switch circuits coupled to the bootstrap circuit. The uniform $V_{GS}$ makes the on-resistance ($R_{ON}$) of the switched relatively constant for varying input voltages.

Figure 7:
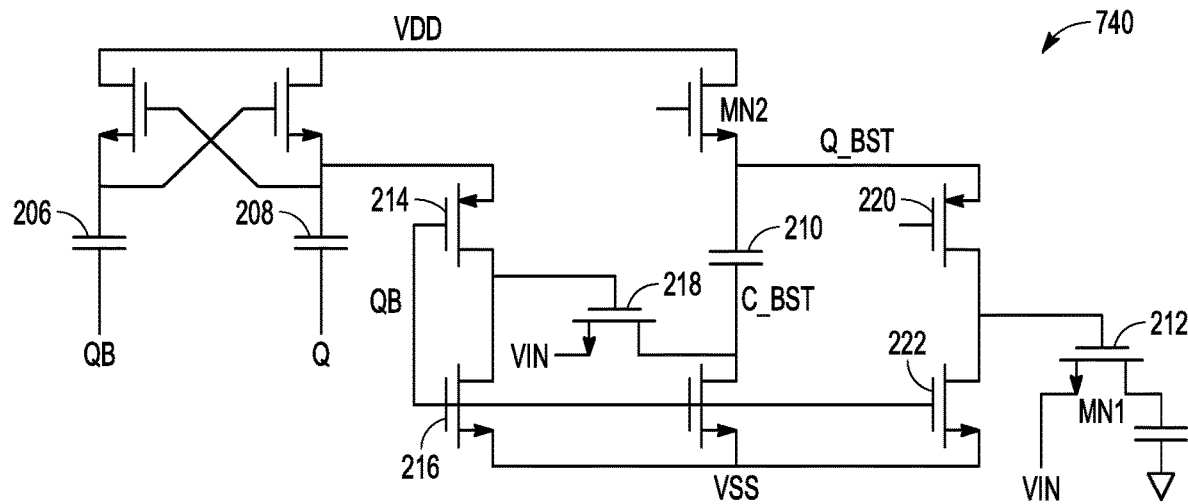
FIG. 7 is a circuit schematic of an example of a bootstrap circuit.

FIG. 7 is a circuit schematic of an example of a bootstrap circuit 740. The bootstrap circuit 740 creates a boosted voltage (Q_BST) using the input voltage (VIN) to drive the gate of the sampling switch circuit. Because the resulting gate voltage largely tracks the input voltage, the sampling switch circuits have a stable $V_{GS}$ regardless of the value of the input voltage.

The sampling switches of the MSB capacitors of the DAC circuit of the ADC may be disabled in the low-resolution mode. For this reason, the bootstrap circuit may be partitioned. If there are N weighted capacitances in the DAC (e.g., N=16), and M of the MSBs are not used in the low-resolution mode (e.g., M=1, or M=2), the bootstrapping can be partitioned into a bootstrap circuit connected to the N–M (e.g., 15) of the least significant weighted bit capacitors and another bootstrap circuit connected to the most significant M weighted bit capacitors (e.g., the MSB capacitor).

Figure 8:
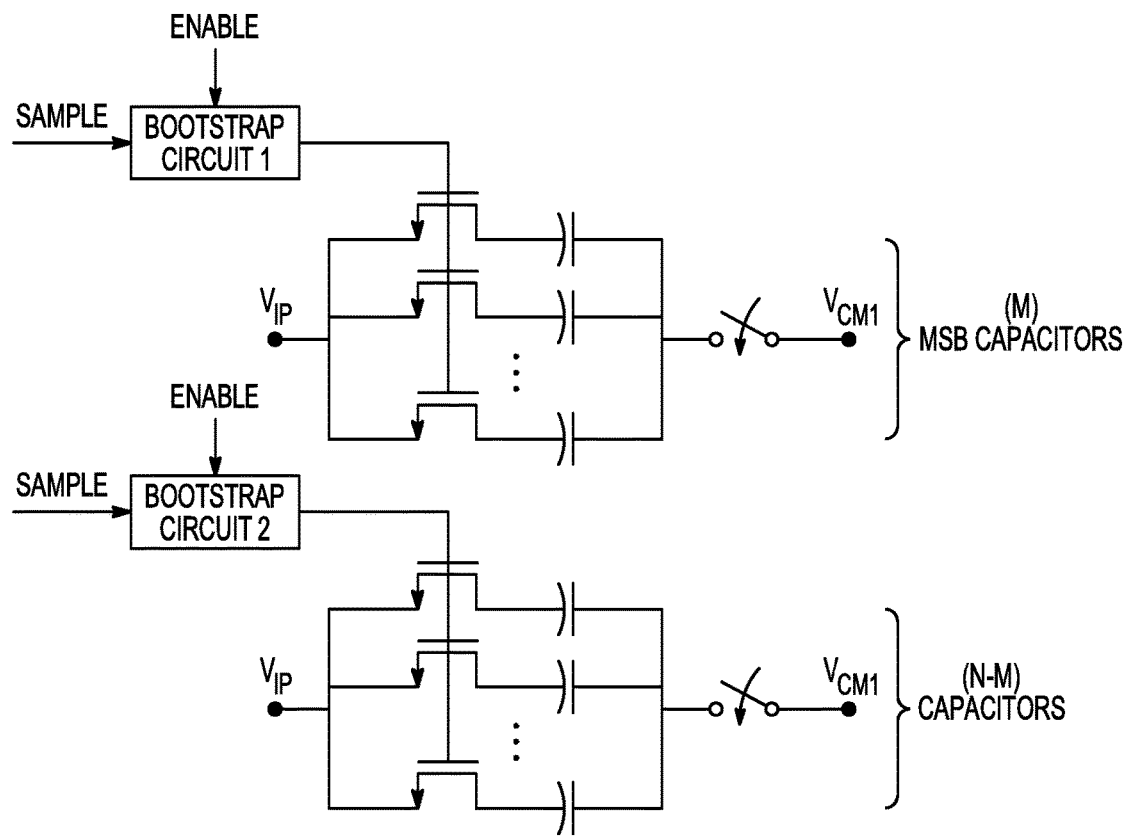
FIG. 8 is a block diagram of a partitioned bootstrap circuit.

FIG. 8 is a block diagram of a partitioned bootstrap circuit. When in the low-resolution mode, only the bootstrap circuit is enabled that is connected to the N–M the least significant weighted bit capacitors. In the high-resolution mode, both bootstrap circuits are enabled.

The most significant bits in a DAC circuit may be shuffled. Capacitors used in the DAC circuit may not match as closely as desired and there may be some random mismatch among the capacitors. Shuffling includes implementing one or more binary weighted MSB capacitances as several equally weighted capacitors. For a given code, the shuffler will select a different combination of the equally weighted capacitors in every conversion. This will make sure that the utilization of the equally weighted capacitors is uncorrelated with respect to the input, and hence any mismatch in the equally weighted capacitors will not result in linearity errors.

FIG. 9 is a block diagram of an example of logic to shuffle bits of an ADC. For an N bit ADC, L of the most significant weighted bit capacitances may be implemented as $2^L-1$ equally weighted capacitors, where N and L are positive integers. The L bit binary code for the L MSBs may be converted to a $2^L-1$ thermometric code using decoder 945. In the thermometric code, the number of ones is in the $2^L-1$ bits is equal to the value of the binary code. FIG. 11 is a table showing an example of a binary code and the corresponding thermometric code. As shown in FIG. 9, the thermometric code is shuffled using logarithmic shifter 950.

An alternative to the thermometric code in FIG. 9 is a structured equally-weighted code. In a structurally equally-weighted code, the $2^L-1$ bits are separated into L segments of $2^0$ bits, $2^1$ bits, $2^{(L-1)}$ bits, and the bits of those segments are ones if the $0^{th}$ bit, $1^{st}$ bit, $(L-1)^{th}$ bit of the binary code is a one. The table of FIG. 11 shows an example of a binary code and the corresponding structured equally-weighted code. In FIG. 10, the input to the logarithmic shifter is the structured equally-weighted code, and the thermometric code is shuffled using logarithmic shifter 1050.

Figure 12:
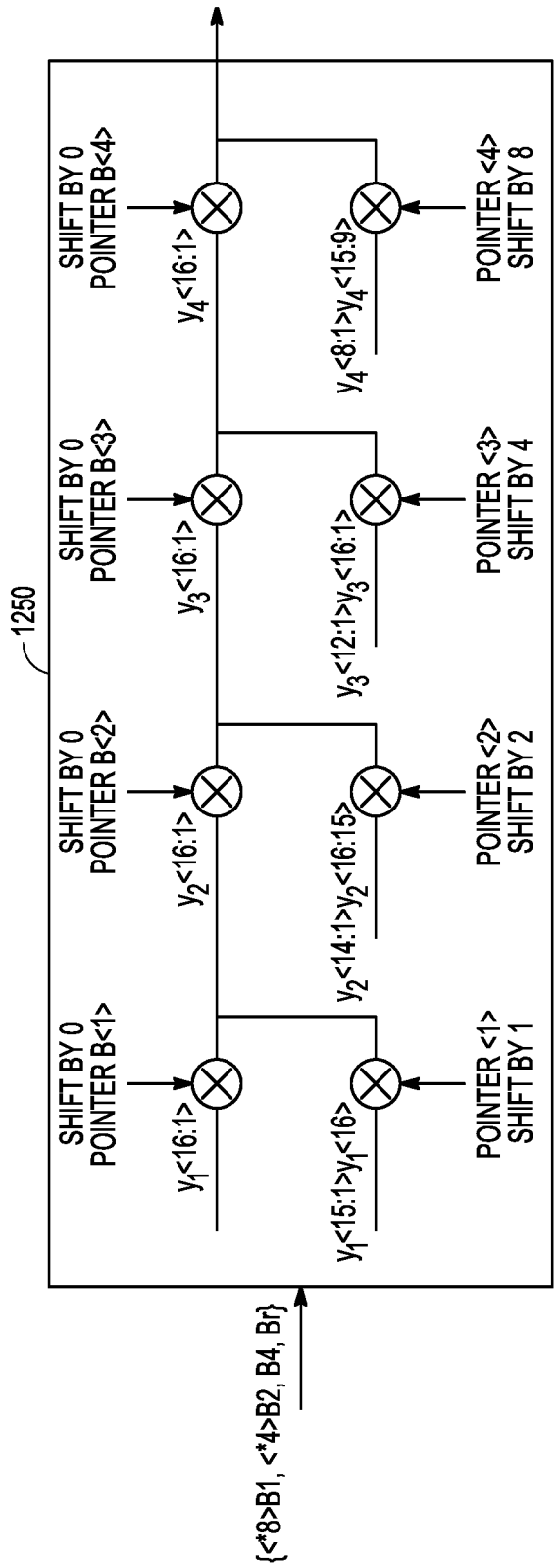
FIG. 12 is a logic diagram of an example implementation of a logarithmic shifter.

FIG. 12 is a logic diagram of an example of an implementation of a logarithmic shifter 1250. Four code bits (B1, B2, B3, B4) are decoded to 16 structured equally-weighted code bits at the input to the shifter. The logarithmic shifter has four stages that either don't shift the input to the stage or shift the input to the stage by $1(2^0)$, $2(2^1)$, $4(2^2)$, or $8(2^3)$ bits. FIG. 13 is a Table showing the results of the logarithmic shifting. The output has 16 possible combinations. The probability of any input bit reaching any output position of the shifting is the same.

If the ADC is configured to low-resolution, the number L of the most significant weighted bit capacitances can be equal to or greater than the number of bits M not unused in the low-resolution mode. In an illustrative example intended to be non-limiting, if the ADC is a 16-bit ADC in the high-resolution mode, the three MSBs (L=3) of the ADC may be implemented as 7 ($2^3-1$) equally weighted capacitors. The ADC may be a 14-bit ADC in the low-resolution mode (M=1, or M=2).

If the capacitors of the ADC used in a sampling phase are randomized by the shuffling in the low-resolution mode, the capacitors that participate in the sampling need not be the capacitors used to load the conversion result. When the ADC enters a subsequent sampling phase, the charge on the capacitors will not be preserved. The input amplifier has to restore the charge, which adds to the loading of the input amplifier. This may defeat the effort to reduce the load on the input amplifier when using a low-resolution mode.

One approach to making the selectable high and low resolution compatible with shuffling is to not shuffle the order of the $2^L-1$ most significant capacitors when operating in the low-resolution mode. The shuffling can be made a feature that is enabled or disabled depending on the selected high or low resolution. This will partition the shuffling circuitry so that charge is preserved for shuffling when operating in the low-resolution mode.

Figure 14:
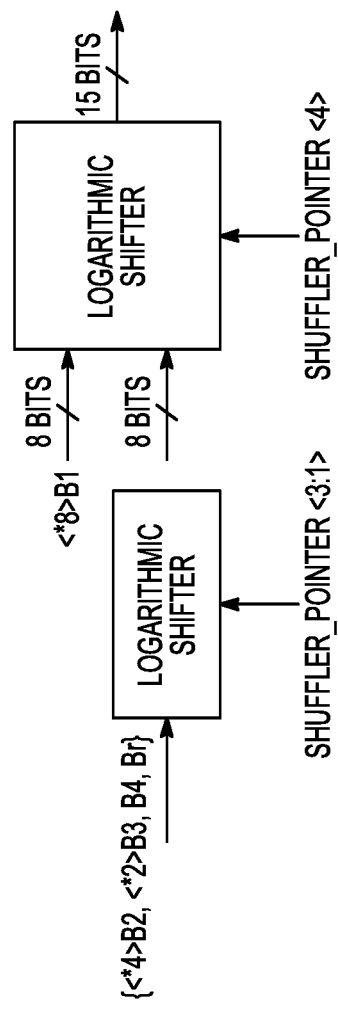
FIG. 14 is a block diagram of another example implementation of a logarithmic shifter.

FIG. 14 is a block diagram of another example implementation of a logarithmic shifter to shuffle bit decisions of an ADC. As in the example of FIG. 10, the input to the shifter is a structured equally-weighted code, but the logarithmic shifter is divided into two partitions controlled by different bits of a pointer. In variations, the two partitions are controlled by different pointers.

Figure 15:
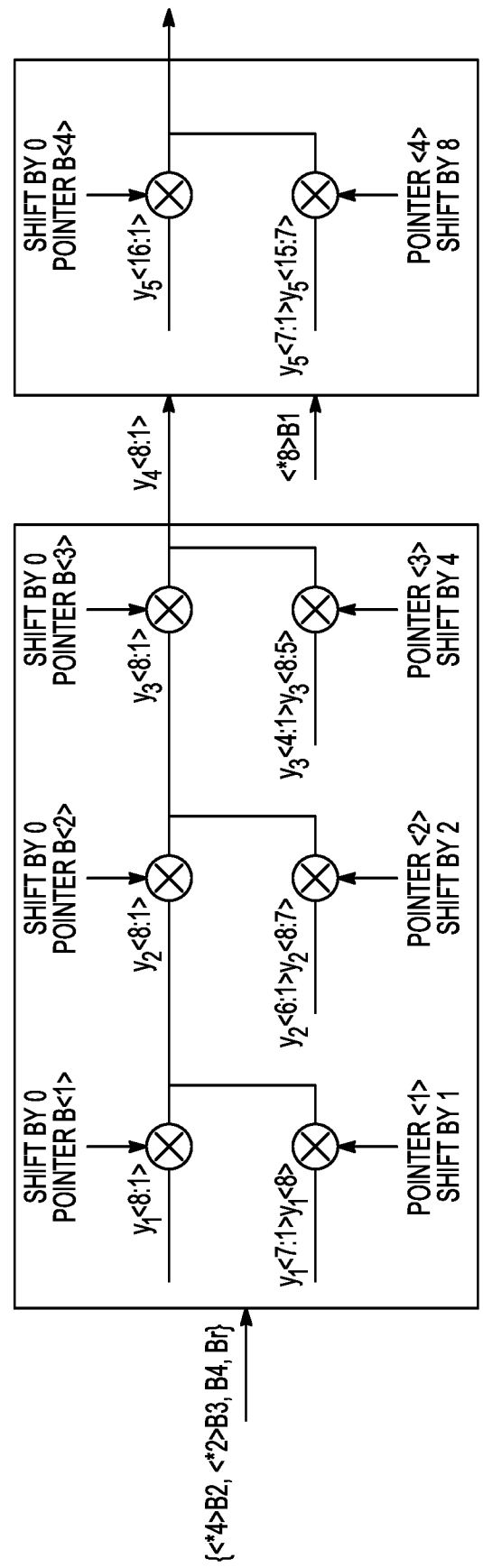
FIG. 15 is a logic diagram of the example implementation of the logarithmic shifter of FIG. 14.

FIG. 15 is a logic diagram of an implementation of the example partitioned logarithmic shifter of FIG. 14. Four code bits (L=4) are decoded to a 16-bit structured equally-weighted code and input to the logarithmic shifter. However, the decoded eight bits corresponding to code bits B2, B3, B4 are input to the first partition and the decoded eight bits corresponding to the fourth bit (B1) are input to the second partition. The partitions are controlled by a 4-bit pointer. In some aspects, the shuffler pointer is a 4-bit linear feedback shifter register (LFSR).

The first partition includes three stages to shift the 8 input bits 1, 2, or 4 times or to not shift the bits. The first three bits of the pointer (pointer <1>, <2>, <3>) control the three stages of the first partition. The output of the first partition is provided to the second partition so that there are 16 bits at the second partition. The second partition is controlled by the fourth bit of the pointer (pointer<4>). If the ADC is being operated in the high-resolution mode, the second partition either shifts the input bits 8 times or does not shift the bits. If the ADC is being operated in the low-resolution mode, the second partition never shifts the 16 bits and the bits are passed through.

FIG. 16 is a table that shows the results of the shifting by the logarithmic shifter of FIGS. 14 and 15. In the high-resolution mode, the output has 16 possible combinations. In the low-resolution mode, the shifting is not applied to the $2^L-1$ most significant capacitors and the output has 8 possible combinations.

The partitioned shuffling in the low-resolution mode preserves the charge of the sampling because the M MSBs not used in the conversion are removed from the shuffling. When the ADC circuit operates in the high-resolution mode, the input voltage is sampled on the capacitors including the $2^L-1$ equally weighted capacitors of the L MSBs. The order of the $2^L-1$ capacitors is shuffled for each conversion.

When the ADC circuit operates in the low-resolution mode, input voltage is sampled onto $2^{(L-M)}-1$ capacitors of the $2^L-1$ capacitors and $V_{CM}$ is sampled onto the other $(2^L-2^{(L-M)})$ capacitors. By partitioning the shuffling, the $2^{(L-M)}-1$ capacitors that sample the input voltage are shuffled and the $(2^L-2^{(L-M)})$ capacitors that sample $V_{CM}$ are not shuffled. In this way, the charge is preserved by the shuffling.

While the concepts discussed have been described in regard to a single ended ADC, the concepts can be applied to a differential ADC. The differential ADC includes two DAC circuits that each have the N weighted bit capacitors. A differential input voltage is sampled onto the weighted bit capacitors with respect to the common mode voltage.

In the high-resolution mode, the differential input voltage is sampled onto all of the N weighted bit capacitors of the first and second DAC circuits. Successive bit trials convert the differential input voltage to the N-bit digital value by comparing an output of the first DAC circuit and an output of the second DAC circuit using a comparator circuit. In the low-resolution mode, the differential input voltage is sampled onto N–M of the least significant of the N weighted bit capacitors of the first and second DAC circuits and $V_{CM}$ is sampled onto the M most significant of the N weighted bit capacitors. Successive bit trials are performed to convert the input voltage to the N–M bit digital value. Shuffling of the bit decisions can be performed as described above.

Figure 17:
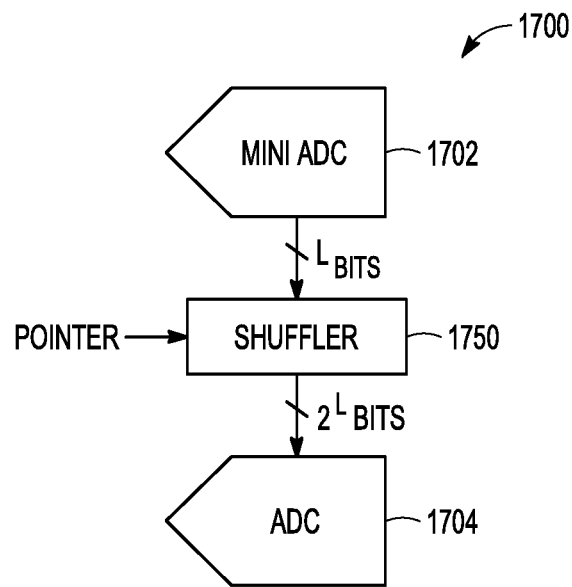
FIG. 17 is a block diagram of an example of two-stage ADC circuit.

The concepts can also be applied to the ADC shown in FIG. 17. It includes a mini ADC circuit 1702 and a main ADC circuit 1704. The main ADC circuit 1704 itself can be implemented in one stage or in multiple stages (sometimes called pipelining). The mini ADC circuit 1702 resolves the first most significant bits (MSBs) of the conversion of the input (e.g., the first five MSBs B1-B5). The output of the mini-ADC may be loaded onto the slower but more accurate main ADC circuit to resolve the remaining bits of the conversion.

In some aspects, shuffling is performed on the mini-ADC and the mini-ADC may include shuffling logic partitioned for use in the low-resolution mode. The output of the mini-ADC may be shuffled using shuffler 1750 to make sure the capacitors of the most significant bits are selected with equal probability and the effect of their mismatch becomes randomized.

The resolution of the main ADC 1704 may be selectable. For example, in a high-resolution mode, the main DAC of the main ADC may have 7-8 capacitors and the input voltage is sampled on all the capacitors. Sixteen bit trials are performed (using the mini-ADC and the main ADC together) to generate a 16-bit result. For the same ADC configured to the low-resolution mode, the input voltage is sampled onto all the capacitors except the MSB capacitor in the main DAC of the main ADC (e.g., 6-7 of the capacitors). Fourteen bit trials are performed to generate a 14-bit result.

Figure 18:
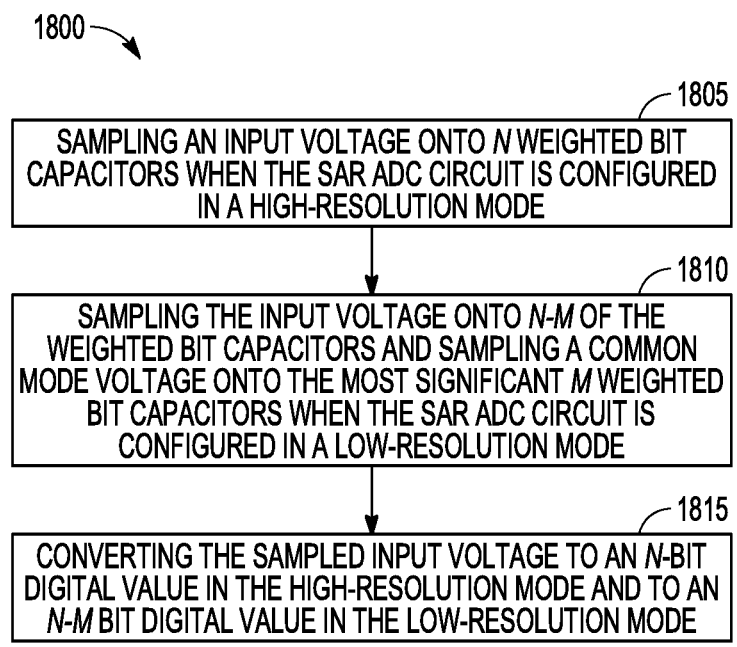
FIG. 18 is an example of a method of operating an SAR ADC.

FIG. 18 is a flow diagram of a method of operating an SAR ADC circuit. At 1805, an input voltage is sampled onto N weighted bit capacitors when the SAR ADC circuit is configured in a high-resolution mode. At 1810, the input voltage is sampled onto N–M of the weighted bit capacitors and sampling a common mode voltage onto the most significant M weighted bit capacitors when the SAR ADC circuit is configured in a low-resolution mode, where N and M are both positive integers and M is greater than zero and less than N. At 1815, the sampled input voltage is converted to an N-bit digital value in the high-resolution mode and converted to an N–M bit digital value in the low-resolution mode. Examples have been described where the resolution of the ADC is changeable from 16 bits to 14 bits (N=16, M=2), but other resolutions are possible (e.g., 16 bits to 12 bits, and N=16, M=4).

The devices, systems and methods described herein provide an ADC circuit topology that can have multiple resolutions. This makes the ADC circuit portable among multiple applications.

ADDITIONAL DESCRIPTION AND ASPECTS

A first Aspect (Aspect 1) can include subject matter (such as a successive approximation register analog-to-digital converter (SAR ADC) circuit) comprising N weighted bit capacitors, where N is a positive integer greater than one; a sampling circuit configured to sample an input voltage onto the N weighted bit capacitors; and logic circuitry. The logic circuitry is configured to enable sampling of the input voltage onto the N weighted bit capacitors in a high-resolution mode; enable sampling of the input voltage onto N–M of the weighted bit capacitors in a low-resolution mode and sampling a common mode voltage onto the most significant M weighted bit capacitors, wherein M is a positive integer greater than zero and less than N; and initiate successive bit trials using the weighted bit capacitors to convert the sampled input voltage to a digital value.

In Aspect 2, the subject matter of Aspect 1 optionally includes logic circuitry configured to, in the low-resolution mode, initiate the successive bit trials using all N weighted bit capacitors including the most significant M weighted bit capacitors to convert the sampled input voltage to a digital value.

In Aspect 3, the subject matter of Aspect 1 optionally includes logic circuitry configured to, in the low-resolution mode, initiate the successive bit trials using the N–M weighted bit capacitors and excluding the most significant M weighted bit capacitors to convert the sampled input voltage to a digital value.

In Aspect 4, the subject matter of one or any combination of Aspects 1-3 optionally includes a first bootstrap circuit coupled to switch circuits connected to the N–M of the weighted bit capacitors, a second bootstrap circuit coupled to switch circuits connected to the most significant M weighted bit capacitors, wherein a bootstrap circuit is configured to provide a uniform gate-to-source voltage ($V_{GS}$) to switch circuits coupled to the bootstrap circuit, and logic circuitry configured to enable the first bootstrap circuit and the second bootstrap circuit in the high-resolution mode; and enable only the first bootstrap circuit in the low-resolution mode.

In Aspect 5, the subject matter of one or any combination of Aspects 1-4 optionally includes L of the most significant weighted bit capacitances implemented as $2^L-1$ equally weighted capacitors, wherein L is a positive integer greater than or equal to M, and logic circuitry configured to shuffle an order of the $2^L-1$ capacitors when the SAR ADC circuit is configured in the high-resolution mode; and not shuffle the $2^L-1$ capacitors when the SAR ADC circuit is configured in the low-resolution mode.

In Aspect 6, the subject matter of one or any combination of Aspects 1-4 optionally includes L of the most significant weighted bit capacitances implemented as $2^L-1$ equally weighted capacitors, wherein L is a positive integer greater than or equal to M, and logic circuitry configured to sample the input voltage on the $2^L-1$ capacitors when the SAR ADC circuit is configured in the high-resolution mode, shuffle an order of the $2^L-1$ capacitors when the SAR ADC circuit is configured in the high-resolution mode; sample the input voltage on $2^{(L-M)}-1$ capacitors of the $2^L-1$ capacitors and sample the common mode voltage onto the other $(2^L-2^{(L-M)})$ capacitors of the $2^L-1$ capacitors when the SAR ADC circuit is configured in the low-resolution mode; and shuffle an order of the $2^{(L-M)}-1$ capacitors and not shuffle an order of the $(2^L-2^{(L-M)})$ capacitors when the SAR ADC circuit is configured in the low-resolution mode.

In Aspect 7, the subject matter of one or any combination of Aspects 1-4 optionally includes L of the most significant weighted bit capacitances implemented as $2^L-1$ equally weighted capacitors, wherein L is a positive integer greater than or equal to M; and logic circuitry that includes decoder circuitry configured to select bit decisions of the $2^L-1$ capacitors to convert the input voltage using a structured equally-weighted code.

In Aspect 8, the subject matter of Aspect 7 optionally includes logic circuitry configured to logarithmically shift the order of the $2^L-1$ capacitors to shuffle results of the bit decisions for the $2^L-1$ capacitors when the SAR ADC circuit is configured in the high-resolution mode.

In Aspect 9, the subject matter of one or both of Aspects 7 and 8 optionally includes logic circuitry configured to logarithmically shift the order of the $2^{(L-M)}-1$ capacitors of the $2^L-1$ capacitors when the SAR ADC circuit configured in the low-resolution mode.

Aspect 10 can include subject matter (such as a method of operating an SAR ADC circuit) or can optionally be combined with one or any combination of Aspects 1-9 to include such subject matter, comprising sampling an input voltage onto N weighted bit capacitors when the SAR ADC circuit is configured in a high-resolution mode, wherein N is a positive integer greater than one; sampling the input voltage onto N-M of the weighted bit capacitors and sampling a common mode voltage onto the most significant M weighted bit capacitors when the SAR ADC circuit is configured in a low-resolution mode, wherein M is a positive integer greater than zero and less than N; and converting the sampled input voltage to a digital value in the high-resolution mode and, when the SAR ADC circuit is configured in the low-resolution mode, converting the sampled input voltage to a digital value having less bits than in the high-resolution mode.

In Aspect 11, the subject matter of Aspect 10 optionally includes performing bit trials using the most significant M weighted bit capacitors with the sampled common mode voltage to convert the input voltage to the digital value when the SAR ADC circuit is configured in the low-resolution mode.

In Aspect 12, the subject matter of Aspect 10 optionally includes performing bit trials using the most significant M weighted bit capacitors to convert the input voltage to the digital value when the SAR ADC circuit is configured in the low-resolution mode.

In Aspect 13, the subject matter of one or any combination of Aspects 10-12 optionally includes providing a uniform gate-to-source voltage ($V_{GS}$) to switches coupled to the N weighted bit capacitors when the SAR ADC circuit is configured in the high-resolution mode; and providing a uniform gate-to-source voltage ($V_{GS}$) to switches coupled to the N-M of the weighted bit capacitors when the SAR ADC circuit is configured in the low-resolution mode.

In Aspect 14, the subject matter of one or any combination of Aspects 10-13 optionally includes implementing L of the most significant weighted bit capacitances as $2^L-1$ equally weighted capacitors, wherein L is a positive integer greater than or equal to M; shuffling an order of the $2^L-1$ capacitors when the SAR ADC circuit is configured in the high-resolution mode; and not shuffling the order of the $2^L-1$ capacitors when the SAR ADC circuit is configured in the low-resolution mode.

In Aspect 15, the subject matter of one or any combination of Aspects 10-13 optionally includes implementing L of the most significant weighted bit capacitances as $2^L-1$ equally weighted capacitors, wherein L is a positive integer greater than or equal to M; sampling the input voltage on the $2^L-1$ capacitors when the SAR ADC circuit is configured in the high-resolution mode; sampling the input voltage on $2^{(L-M)}-1$ capacitors of the $2^L-1$ capacitors and sample the common mode voltage onto the other $(2^L-2^{(L-M)})$ capacitors of the $2^L-1$ capacitors when the SAR ADC circuit is configured in the low-resolution mode; shuffling an order of the $2^L-1$ capacitors when the SAR ADC circuit is configured in the high-resolution mode; and shuffling an order of the $2^{(L-M)}-1$ capacitors and not shuffling the $(2^L-2^{(L-M)})$ capacitors when the SAR ADC circuit is configured in the low-resolution.

In Aspect 16, the subject matter of one or any combination of Aspects 10-13 optionally includes implementing L of the most significant weighted bit capacitances as $2^L-1$ equally weighted capacitors, wherein L is a positive integer greater than or equal to M; and selecting bit decisions of the $2^L-1$ capacitors using a structured equally-weighted code for use in converting the input voltage.

In Aspect 17, the subject matter of Aspect 16 optionally includes logarithmically shifting the order of the $2^L-1$ capacitors when the SAR ADC circuit is configured in the high-resolution mode.

In Aspect 18, the subject matter of one or both of Aspects 16 and Aspect 17 optionally includes logarithmically shifting the of $2^{(L-M)}-1$ capacitors of the $2^L-1$ capacitors when the SAR ADC circuit is configured in the low-resolution mode.

Aspect 19 can include subject matter (such as an ADC circuit) or can optionally be combined with one or any combination of Aspects 1-18 to include such subject matter, comprising a first digital-to-analog converter (DAC) circuit, a sampling circuit, a comparator circuit coupled to the DAC circuit, and logic circuitry coupled to the first DAC circuit, the sampling circuit, and the comparator circuit. The first DAC circuit includes N weighted bit capacitors, wherein N is a positive integer greater than one. The sampling circuit includes multiple switch circuits and an input amplifier circuit coupled to the N weighted bit capacitors, wherein the sampling circuit is configured to sample an input voltage onto the N weighted bit capacitors. The logic circuitry is configured to initiate, in a high-resolution mode, sampling of the input voltage onto the N weighted bit capacitors and successive bit trials to convert the input voltage to a digital value by comparing an output of the first DAC circuit using the comparator circuit; and initiate, in a low-resolution mode, sampling of the input voltage onto N-M of the least significant of the N weighted bit capacitors and sample a common mode voltage onto M the most significant of the N weighted bit capacitors and successive bit trials to convert the input voltage to a digital value having less bits than in the high-resolution mode, wherein M is a positive integer less than N.

In Aspect 20, the subject matter of Aspect 19 optionally includes L of the most significant weighted bit capacitances are implemented as $2^L-1$ equally weighted capacitors, wherein L is a positive integer greater than or equal to M; and logic circuitry configured to sample the input voltage on the $2^L-1$ capacitors when the SAR ADC circuit is configured in the high-resolution mode; shuffle an order of the $2^L-1$ capacitors when the SAR ADC circuit is configured in the high-resolution mode; sample the input voltage on $2^{(L-M)}-1$ capacitors of the $2^L-1$ capacitors and sample the common mode voltage onto the other $(2^L-2^{(L-M)})$ capacitors of the $2^L-1$ capacitors when the SAR ADC circuit is configured in the low-resolution mode; and shuffle an order of the $2^{(L-M)}-1$ capacitors and not shuffle the $(2^L-2^{(L-M)})$ capacitors when the SAR ADC circuit is configured in the low-resolution mode.

In Aspect 21, the subject matter of one or both of Aspects 19 and 20 optionally includes a second DAC circuit including N weighted bit capacitors; a sampling circuit configured to sample a differential input voltage onto the N weighted bit capacitors of the first DAC circuit and the N weighted bit capacitors of the second DAC circuit with respect to the common mode voltage; and logic circuitry configured to initiate, in the high-resolution mode, sampling of the differential input voltage onto the N weighted bit capacitors of the first and second DAC circuits and successive bit trials to convert the differential input voltage to the digital value by comparing an output of the first DAC circuit and an output of the second DAC circuit using the first comparator circuit; and initiate, in a low-resolution mode, sampling of the differential input voltage onto N–M of the least significant of the N weighted bit capacitors of the first and second DAC circuits and sample a common mode voltage onto M the most significant of the N weighted bit capacitors, and initiate successive bit trials to convert the input voltage to the digital value having less bits than in the high-resolution mode.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A successive approximation register analog-to-digital converter (SAR ADC) circuit comprising:
   N weighted bit capacitors, wherein N is a positive integer greater than one;
   a sampling circuit configured to sample an input voltage onto the N weighted bit capacitors; and
   logic circuitry configured to:
      enable sampling of the input voltage onto the N weighted bit capacitors in a high-resolution mode;
      enable sampling of the input voltage onto N–M of the weighted bit capacitors in a low-resolution mode and sampling a common mode voltage onto the most significant M weighted bit capacitors, wherein M is a positive integer greater than zero and less than N; and
      initiate successive bit trials using the weighted bit capacitors to convert the sampled input voltage to a digital value.

2. The SAR ADC circuit of claim 1, wherein the logic circuitry is configured to, in the low-resolution mode, initiate the successive bit trials using all N weighted bit capacitors including the most significant M weighted bit capacitors to convert the sampled input voltage to a digital value.

3. The SAR ADC circuit of claim 1, wherein the logic circuitry is configured to, in the low-resolution mode, initiate the successive bit trials using the N–M weighted bit capacitors and excluding the most significant M weighted bit capacitors to convert the sampled input voltage to a digital value.

4. The SAR ADC circuit of claim 1, including:
   a first bootstrap circuit coupled to switch circuits connected to the N–M of the weighted bit capacitors;
   a second bootstrap circuit coupled to switch circuits connected to the most significant M weighted bit capacitors, wherein a bootstrap circuit is configured to provide a uniform gate-to-source voltage ($V_{GS}$) to switch circuits coupled to the bootstrap circuit; and
   wherein the logic circuitry is configured to:
      enable the first bootstrap circuit and the second bootstrap circuit in the high-resolution mode; and
      enable only the first bootstrap circuit in the low-resolution mode.

5. The SAR ADC circuit of claim 1,
   wherein L of the most significant weighted bit capacitances are implemented as $2^L-1$ equally weighted capacitors, wherein L is a positive integer greater than or equal to M;

wherein the logic circuitry is configured to:
    shuffle an order of the $2^L-1$ capacitors when the SAR ADC circuit is configured in the high-resolution mode; and
    not shuffle the $2^L-1$ capacitors when the SAR ADC circuit is configured in the low-resolution mode.

6. The SAR ADC circuit of claim 1,
wherein L of the most significant weighted bit capacitances are implemented as $2^L-1$ equally weighted capacitors, wherein L is a positive integer greater than or equal to M;
wherein the logic circuitry is configured to:
    sample the input voltage on the $2^L-1$ capacitors when the SAR ADC circuit is configured in the high-resolution mode;
    shuffle an order of the $2^L-1$ capacitors when the SAR ADC circuit is configured in the high-resolution mode;
    sample the input voltage on $2^{(L-M)}-1$ capacitors of the $2^L-1$ capacitors and sample the common mode voltage onto the other $(2^L-2^{(L-M)})$ capacitors of the $2^L-1$ capacitors when the SAR ADC circuit is configured in the low-resolution mode; and
    shuffle an order of the $2^{(L-M)}-1$ capacitors and not shuffle an order of the $(2^L-2^{(L-M)})$ capacitors when the SAR ADC circuit is configured in the low-resolution mode.

7. The SAR ADC circuit of claim 1,
wherein L of the most significant weighted bit capacitances are implemented as $2^L-1$ equally weighted capacitors, wherein L is a positive integer greater than or equal to M;
wherein the logic circuitry includes decoder circuitry configured to select bit decisions of the $2^L-1$ capacitors to convert the input voltage using a structured equally-weighted code.

8. The SAR ADC circuit of claim 7, wherein the logic circuitry is configured to logarithmically shift the order of the $2^L-1$ capacitors to shuffle results of the bit decisions for the $2^L-1$ capacitors when the SAR ADC circuit is configured in the high-resolution mode.

9. The SAR ADC circuit of claim 7, wherein the logic circuitry is configured to logarithmically shift the order of the $2^{(L-M)}-1$ capacitors of the $2^L-1$ capacitors when the SAR ADC circuit configured in the low-resolution mode.

10. A method of operating a successive approximation register analog-to-digital converter (SAR ADC) circuit, the method comprising:
    sampling an input voltage onto N weighted bit capacitors when the SAR ADC circuit is configured in a high-resolution mode, wherein N is a positive integer greater than one;
    sampling the input voltage onto N–M of the weighted bit capacitors and sampling a common mode voltage onto the most significant M weighted bit capacitors when the SAR ADC circuit is configured in a low-resolution mode, wherein M is a positive integer greater than zero and less than N; and
    converting the sampled input voltage to a digital value in the high-resolution mode and, when the SAR ADC circuit is configured in the low-resolution mode, converting the sampled input voltage to a digital value having less bits than in the high-resolution mode.

11. The method of claim 10, wherein the converting includes performing bit trials using the most significant M weighted bit capacitors with the sampled common mode voltage to convert the input voltage to the digital value when the SAR ADC circuit is configured in the low-resolution mode.

12. The method of claim 10, wherein the converting excludes performing bit trials using the most significant M weighted bit capacitors to convert the input voltage to the digital value when the SAR ADC circuit is configured in the low-resolution mode.

13. The method of claim 10, including:
    providing a uniform gate-to-source voltage ($V_{GS}$) to switches coupled to the N weighted bit capacitors when the SAR ADC circuit is configured in the high-resolution mode; and
    providing a uniform gate-to-source voltage ($V_{GS}$) to switches coupled to the N–M of the weighted bit capacitors when the SAR ADC circuit is configured in the low-resolution mode.

14. The method of claim 10, including:
    implementing L of the most significant weighted bit capacitances as $2^L-1$ equally weighted capacitors, wherein L is a positive integer greater than or equal to M; and
    wherein converting the sampled input voltage to a digital value includes:
        shuffling an order of the $2^L-1$ capacitors when the SAR ADC circuit is configured in the high-resolution mode; and
        not shuffling the order of the $2^L-1$ capacitors when the SAR ADC circuit is configured in the low-resolution mode.

15. The method of claim 10, including:
    implementing L of the most significant weighted bit capacitances as $2^L-1$ equally weighted capacitors, wherein L is a positive integer greater than or equal to M; and
    wherein sampling the input voltage includes:
        sampling the input voltage on the $2^L-1$ capacitors when the SAR ADC circuit is configured in the high-resolution mode;
        sampling the input voltage on $2^{(L-M)}-1$ capacitors of the $2^L-1$ capacitors and sample the common mode voltage onto the other $(2^L-2^{(L-M)})$ capacitors of the $2^L-1$ capacitors when the SAR ADC circuit is configured in the low-resolution mode; and
    wherein converting the sampled input voltage to a digital value includes:
        shuffling an order of the $2^L-1$ capacitors when the SAR ADC circuit is configured in the high-resolution mode; and
        shuffling an order of the $2^{(L-M)}-1$ capacitors and not shuffling the $(2^L-2^{(L-M)})$ capacitors when the SAR ADC circuit is configured in the low-resolution.

16. The method of claim 10, including:
    implementing L of the most significant weighted bit capacitances as $2^L-1$ equally weighted capacitors, wherein L is a positive integer greater than or equal to M; and
    selecting bit decisions of the $2^L-1$ capacitors using a structured equally-weighted code for use in converting the input voltage.

17. The method of claim 16, including logarithmically shifting the order of the $2^L-1$ capacitors when the SAR ADC circuit is configured in the high-resolution mode.

18. The method of claim 16, including logarithmically shifting the of $2^{(L-M)}-1$ capacitors of the $2^L-1$ capacitors when the SAR ADC circuit is configured in the low-resolution mode.

19. An analog-to-digital converter (ADC) circuit comprising:
- a first digital-to-analog converter (DAC) circuit including N weighted bit capacitors, wherein N is a positive integer greater than one;
- a sampling circuit including multiple switch circuits and an input amplifier circuit coupled to the N weighted bit capacitors, wherein the sampling circuit is configured to sample an input voltage onto the N weighted bit capacitors;
- a comparator circuit coupled to the first DAC circuit;
- logic circuitry coupled to the first DAC circuit, the sampling circuit, and the comparator circuit, the logic circuitry configured to:
- initiate, in a high-resolution mode, sampling of the input voltage onto the N weighted bit capacitors and successive bit trials to convert the input voltage to a digital value by comparing an output of the first DAC circuit using the comparator circuit; and
- initiate, in a low-resolution mode, sampling of the input voltage onto N–M of the least significant of the N weighted bit capacitors and sample a common mode voltage onto M the most significant of the N weighted bit capacitors and successive bit trials to convert the input voltage to a digital value having less bits than in the high-resolution mode, wherein M is a positive integer less than N.

20. The ADC circuit of claim 19,
- wherein L of the most significant weighted bit capacitances are implemented as $2^L-1$ equally weighted capacitors, wherein L is a positive integer greater than or equal to M;
- wherein the logic circuitry is configured to:
  - sample the input voltage on the $2^L-1$ capacitors when the SAR ADC circuit is configured in the high-resolution mode;
  - shuffle an order of the $2^L-1$ capacitors when the SAR ADC circuit is configured in the high-resolution mode;
  - sample the input voltage on $2^{(L-M)}-1$ capacitors of the $2^L-1$ capacitors and sample the common mode voltage onto the other $(2^L-2^{(L-M)})$ capacitors of the $2^L-1$ capacitors when the SAR ADC circuit is configured in the low-resolution mode; and
  - shuffle an order of the $2^{(L-M)}-1$ capacitors and not shuffle the $(2^L-2^{(L-M)})$ capacitors when the SAR ADC circuit is configured in the low-resolution mode.

21. The ADC circuit of claim 19, including:
- a second DAC circuit including N weighted bit capacitors;
- wherein the sampling circuit is configured to sample a differential input voltage onto the N weighted bit capacitors of the first DAC circuit and the N weighted bit capacitors of the second DAC circuit with respect to the common mode voltage; and
- wherein the logic circuitry is configured to:
- initiate, in the high-resolution mode, sampling of the differential input voltage onto the N weighted bit capacitors of the first and second DAC circuits and successive bit trials to convert the differential input voltage to the digital value by comparing an output of the first DAC circuit and an output of the second DAC circuit using the first comparator circuit; and
- initiate, in a low-resolution mode, sampling of the differential input voltage onto N–M of the least significant of the N weighted bit capacitors of the first and second DAC circuits and sample a common mode voltage onto M the most significant of the N weighted bit capacitors, and initiate successive bit trials to convert the input voltage to the digital value having less bits than in the high-resolution mode.

* * * * *